United States Patent
Kuroda et al.

(10) Patent No.: US 8,648,614 B2
(45) Date of Patent: Feb. 11, 2014

(54) ELECTRONIC CIRCUIT TESTING APPARATUS

(75) Inventors: Tadahiro Kuroda, Yokohama (JP); Daisuke Mizoguchi, Yokohama (JP); Noriyuki Mirua, Yokohama (JP)

(73) Assignee: KEIO University, Tokyo (JP)

( * ) Notice: Subject to any disclaimer, the term of this patent is extended or adjusted under 35 U.S.C. 154(b) by 637 days.

(21) Appl. No.: 11/664,262

(22) PCT Filed: Sep. 21, 2005

(86) PCT No.: PCT/JP2005/017364
§ 371 (c)(1),
(2), (4) Date: Apr. 4, 2008

(87) PCT Pub. No.: WO2006/035644
PCT Pub. Date: Apr. 6, 2006

(65) Prior Publication Data
US 2008/0258744 A1    Oct. 23, 2008

(30) Foreign Application Priority Data
Sep. 30, 2004 (JP) .................................. 2004-289268

(51) Int. Cl.
*G01R 31/20* (2006.01)

(52) U.S. Cl.
USPC .................................................. 324/754.01

(58) Field of Classification Search
USPC ......... 324/765, 754, 761–762, 158.1, 117 R, 324/117 H; 438/14–18; 257/48
See application file for complete search history.

(56) References Cited

U.S. PATENT DOCUMENTS

| 5,701,037 A | 12/1997 | Weber et al. |
| 5,990,697 A * | 11/1999 | Kazama ........................ 324/761 |
| 6,154,043 A * | 11/2000 | Conboy et al. ........... 324/754.29 |

(Continued)

FOREIGN PATENT DOCUMENTS

| JP | 2-2967 | 1/1990 |
| JP | 8-334541 | 12/1996 |

(Continued)

OTHER PUBLICATIONS

D. Mizoguchi, "A 1.2 Gb/s/pin Wireless Superconnect based on Inductive Inter-chip Signaling (IIS)," IEEE International Solid-State Circuit Conference (ISSCC'04), Dig. Tech.Papers, pp. 142-143 and p. 517, Feb. 2004.

(Continued)

*Primary Examiner* — Tung X Nguyen
(74) *Attorney, Agent, or Firm* — Edwards Wildman Palmer LLP; James E. Armstrong, IV; George N. Chaclas

(57) ABSTRACT

The present invention has an object to provide an electronic circuit testing apparatus that is preferable for testing an electronic circuit which carries out communications between substrates based on inductive coupling and is capable of testing the electronic circuit without using test pads, wherein a probe 15 is caused to intervene in a communications channel composed by inductive coupling based on the first and second transmitter coils 21a, 21b; and the first and second receiver coils 23a, 23b, and an LSI is tested by a tester 11, buffers 12 and 13, and a Tx/Rx switch 14. Accordingly, it is not be necessary for that the electronic circuit testing apparatus is provided with a needle that touches pads and leads of the electronic circuit, and the service life there can be lengthened.

9 Claims, 3 Drawing Sheets

(56) References Cited

U.S. PATENT DOCUMENTS

| | | | |
|---|---|---|---|
| 6,236,223 B1 * | 5/2001 | Brady et al. | 324/750.3 |
| 6,242,923 B1 | 6/2001 | Scaman et al. | |
| 6,657,439 B1 | 12/2003 | Harada | |
| 6,693,426 B1 * | 2/2004 | Xiang et al. | 324/300 |
| 6,958,616 B1 * | 10/2005 | Mahoney et al. | 324/754 |
| 7,109,730 B2 * | 9/2006 | Slupsky | 324/754.21 |
| 7,276,924 B2 * | 10/2007 | Maruyama et al. | 324/750.11 |
| 2001/0028254 A1 | 10/2001 | Buks et al. | |

FOREIGN PATENT DOCUMENTS

| | | |
|---|---|---|
| JP | 10-513261 | 12/1998 |
| JP | 2004-37213 | 2/2004 |
| JP | 2004-173293 | 6/2004 |
| JP | 2005-228981 | 8/2005 |
| TW | 424134 B | 3/2001 |
| TW | 536627 B | 6/2003 |
| WO | WO-02/063675 A1 | 8/2002 |

OTHER PUBLICATIONS

N. Miura et al, Analysis and Design of Transceiver Circuit and Inductor Layout for Inductive Inter-chip Wireless Superconnect, Symposium on VLSI Circuits, Dig. Tech. Papers, pp. 246-249, Jun. 2004.

Japanese Office Action issued Jun. 29, 2011, for Japanese Patent Application No. 2004-289268.

Taiwanese Office Action issued Feb. 9, 2012. (ID No. 10120113420, Feb. 9, 2012).

* cited by examiner

ELECTRONIC CIRCUIT TESTING APPARATUS

BACKGROUND OF THE INVENTION

1. Field of the Invention

The present invention relates to an electronic circuit testing apparatus that is preferable for testing an electronic circuit that carries out, by inductive coupling, communications between substrates such as IC (Integrated Circuit) bare chips, and PCBs (Printed Circuit Boards).

2. Description of the Related Arts

The present inventor et al. have proposed realizing a system in package (SiP) that is capable of sealing a plurality of bare chips in one package of LSI (Large Scale Integration) by utilizing a method for three-dimensionally mounting chips and electrically connecting between chips by means of inductive coupling (Patent Document 1).

FIG. 3 is a view depicting a configuration of an electronic circuit according to the invention of Japanese earlier application. The electronic circuit is composed of the first through the third LSI chips 31a, 31b and 31c, which is an example in which LSI chips are stacked up in three layers and a bus is formed so as to lie across three chips. That is, it composes a single communications channel capable of carrying out communications between the three (between three LSI chips). The first through the third LSI chips 31a, 31b and 31c are vertically stacked up, and the respective chips are fixed to each other with an adhesive agent. The first through the third transmitter coils 33a, 33b and 33c, which are respectively used for transmission, are formed by wiring on the first through the third LSI chips 31a, 31b and 31c, and also the first through the third receiver coils 35a, 35 band 35c, which are respectively used for receiving, are formed by wiring thereon. These coils are disposed on the first through the third LSI chips 31a, 31b and 31c so that the centers of the openings of the three pairs of transmitter and receiver coils 33 and 35 are made coincident with each other. Accordingly, the three pairs of transmitter and receiver coils 33 and 35 form inductive coupling, thereby enabling communications. The first through the third transmitter circuits 32a, 32b and 32c are connected to the first through the third transmitter coils 33a, 33b and 33c respectively, and the first through the third receiver circuits 34a, 34b and 34c are connected to the first through the third receiver coils 35a, 35b and 35c respectively. The transmitter and receiver coils 33 and 35 are three-dimensionally mounted as coils having one or more turns in an area permitted for communications, utilizing a multilayer wiring of a process technology. A profile best suitable for communications exists in the transmitter and receiver coils 33 and 35, and it is necessary that they have an optimal number of times of winding, optimal opening and optimal line width. Generally, the transmitter coils 33 are smaller than the receiver coils 35.

[Patent Document 1] Japanese Patent Application No.

DISCLOSURE OF THE INVENTION

Problems to be Solved by the Invention

Conventionally, when testing an electronic circuit such as an IC during production, a test signal is supplied to a pad (input pad and/or test pad) of a chip, and a signal (voltage value and/or a current value) of a pad (output pad and/or test pad) of the chip is detected. Therefore, when testing the electronic circuit, a needle to touch a small pad is requisite, and a number of electronic circuit tests make the tip end of the needle worn away. Accordingly, the service life of usual electronic circuit testing apparatuses is short.

Also, it is necessary that test pads, in addition to the input pad and output pad, are provided in the electronic circuit to be tested. Attempts to obtain a number of types of output from a number of types of input in a multi-function IC or the like have to be preceded by laying test pads; therefore, the design of the electronic circuit is subjected to some restriction.

In view of the above-described problems, it is an object of the present invention to provide an electronic circuit testing apparatus that is preferable particularly for testing an electronic circuit for communications between substrates based on inductive coupling and is capable of testing the same electronic circuit without using any test pad.

Means for Solving the Problems

An electronic circuit test apparatus according to the present invention includes probes having coils to transmit and receive signals.

Herein, since the probes are two-dimensionally movable, test can be conducted with a small number of probes.

Also, since a plurality of probes are provided, a complicated test can be carried out in a short time.

The electronic circuit testing apparatus according to the invention includes a transmitter coil for transmitting signals and a receiver coil for receiving signals.

In addition, since the transmitter coil and the receiver coil are formed by wiring on a single substrate, it is possible to easily test a small electronic circuit.

Further, since the transmitter coil and the corresponding receiver coil are coaxially disposed, it is possible to transmit test signals into a predetermined communications channel and receive detection signals from the same communications channel.

Effects of the Invention

According to the invention, it is possible to test an electronic circuit in a contact-free state. Therefore, it is not necessary for an electronic circuit testing apparatus to be provided with a needle which touches the pad of the electronic circuit; consequently, the service life thereof can be lengthened. Further, since no test pad has to be embedded in the electronic circuit, the degree of freedom can be extended in designing the circuit. Still further, while the test with a conventional contact-type probe requires an electrostatic discharge (ESD) protection circuit in input/output circuit being a probe-contacting portion of the electronic circuit, large electrostatic capacitance resulting from a large transistor used in the ESD protection circuit hinders high-speed processing of the input/output circuit. However, the invention does not require any ESD protection circuit because the test is carried out in a contact-free state; therefore, the speed of input/output operation between the probe and the input/output circuit can be made higher, and the test can be conducted on time (that is, not at slow operation for testing but at operation as fast as normal running). Furthermore, since the inductive coupling (that is, L coupling) itself has characteristics of a high-pass filter, it is advantageous for high-speed operation.

The present specification includes the contents described in the specification and/or drawings of Japanese Patent Application No. 2004-289268, which is the basis of priority of the present application.

DESCRIPTION OF REFERENCE SYMBOLS

Figure 1:
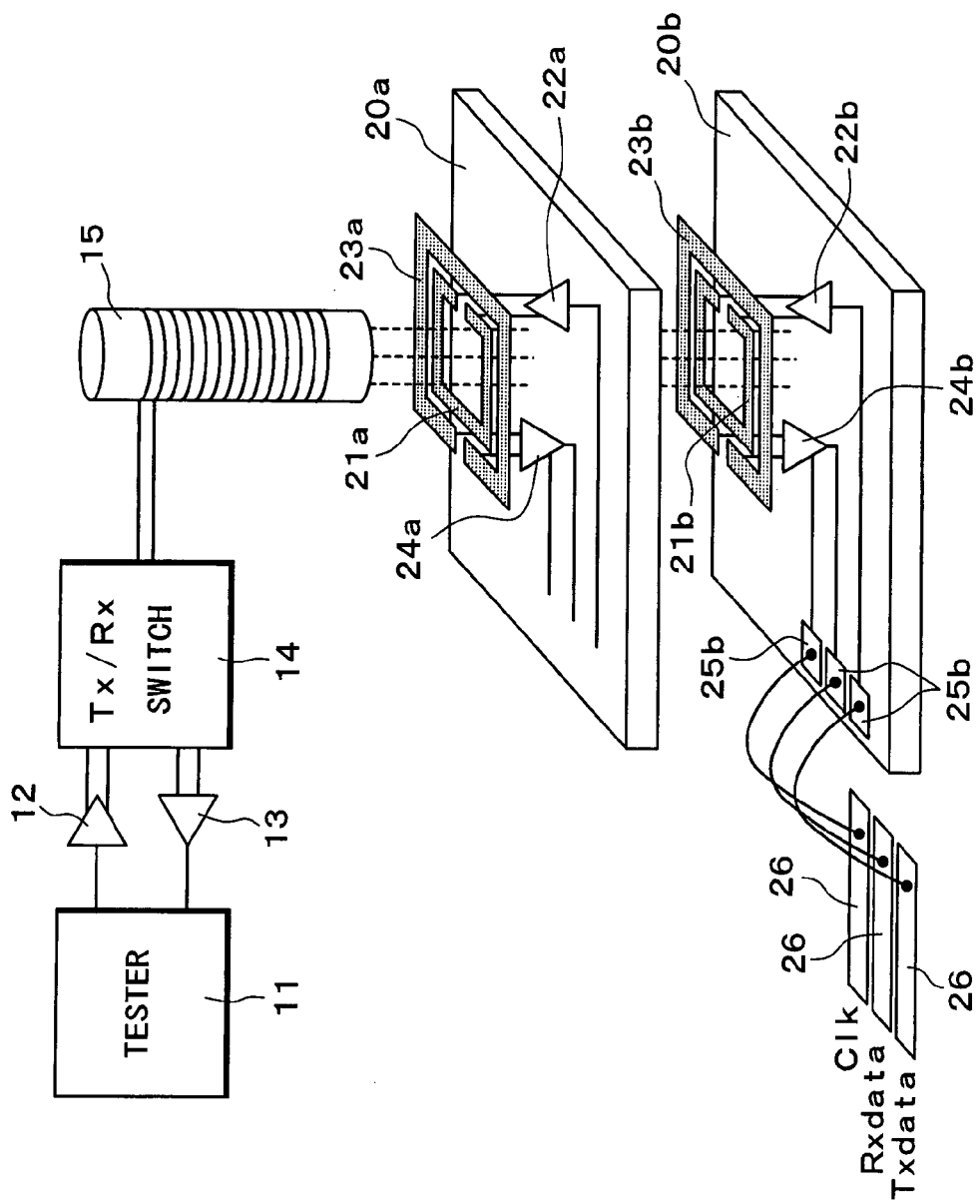
FIG. 1 is a view depicting a configuration of an electronic circuit testing apparatus according to Embodiment 1 of the invention and a configuration of an LSI to be tested.

11 Tester
12, 13 Buffers
14 Tx/Rx switch
20 LSI chip
21 Transmitter coil
22 Transmitter circuit
23 Receiver coil
24 Receiver circuit
25 Pad
26, 27 Leads
31 LSI chip
32 Transmitter circuit
33 Transmitter coil
34 Receiver circuit
35 Receiver coil
Txdata Transmission data
Rxdata Receiving data
Clk Clock

BEST MODE FOR CARRYING OUT THE INVENTION

Hereinafter, a detailed description is given of a best mode by which the invention is embodied, with reference to the accompanying drawings.

Embodiment 1

FIG. 1 is a view depicting a configuration of an electronic circuit testing apparatus according to Embodiment 1 of the invention and a configuration of an LSI to be tested. An electronic circuit testing apparatus according to Embodiment 1 is used for testing a completed LSI. The electronic circuit testing apparatus is composed of a tester 11, buffers 12 and 13, a Tx/Rx switch 14 and a probe 15. The tester 11 prepares a test signal and feeds it to the probe 15 via the buffer 12; receives a signal detected by the probe 15 via the buffer 13; and determines whether the electronic circuit is satisfactory. The buffers 12 and 13 are amplifiers for amplifying the signals. The Tx/Rx switch 14 is a switch for changing over the flow of signals depending on whether transmitting or receiving. When transmitting, the probe 15 is connected to the buffer 12 and is separated from the buffer 13, wherein the input of the buffer 13 is short-circuited. When receiving, the probe 15 is connected to the buffer 13 and is separated from the buffer 12, wherein the output of the buffer 12 is opened. The probe 15 is composed of a coil. When transmitting, the probe 15 irradiates a magnetic line of flux in the vertical direction, is inductively coupled to the coil in an LSI, and feeds a test signal to the LSI. When receiving, the probe 15 generates an electromotive force in response to a change in the magnetic line of flux in the vertical direction from the coil of the LSI, and detects a signal from the LSI.

In the present embodiment, the LSI is the object to be tested and is stacked in two layers as LSI chip 20a and 20b. The LSI chip 20a is provided with a first transmitter coil 21a connected to a first transmitter circuit 22a; and a first receiver coil 23a connected to a first receiver circuit 24a. Similarly, the LSI chip 20b is provided with a second transmitter coil 21b connected to a second transmitter circuit 22b and a second receiver coil 23b connected to a second receiver circuit 24b. The first and second transmitter coils 21a and 21b, and the first and second receiver coils 23a and 23b compose a single communications channel. The second transmitter circuit 22b and the second receiver circuit 24b are, via pads 25b, connected to leads 26, which receive transmission data Txdata and clock Clk, and send out receiving data Rxdata. Although not illustrated, the LSI chips 20a and 20b are equipped with electronic circuits for various uses, which receive transmission data Txdata and clock Clk, and send out receiving data Rxdata. Also, a plurality of communications channels may be composed by providing a plurality of sets of such transmitter and receiver coils, and the number of layers of stacked chips may be three or more. Where an LSI has a plurality of communications channels based on inductive coupling, a plurality of probes 15 may be provided at positions corresponding thereto, or one probe 15 may be moved two-dimensionally on the horizontal plane and may be used to test at respective positions. In this case, the LSI may be moved instead of the probe 15. Although power and clocks for the test may be supplied to the LSI based on inductive coupling, they may be supplied via the leads 26 (lead for power is not illustrated) instead if direct connection is partially permitted.

When actual testing, the communications channel based on inductive coupling between the stacks is intervened by the probe 15, which transmits a test signal and detects a signal to judge whether the LSI is satisfactory or not. Where a plurality of probes 15 are provided, it can be devised that one probe 15 transmits a test signal and the other probe 15 detects a signal.

Thus, Embodiment 1 is capable of testing the object LSIs almost or completely without touching them.

Embodiment 2

Figure 2:
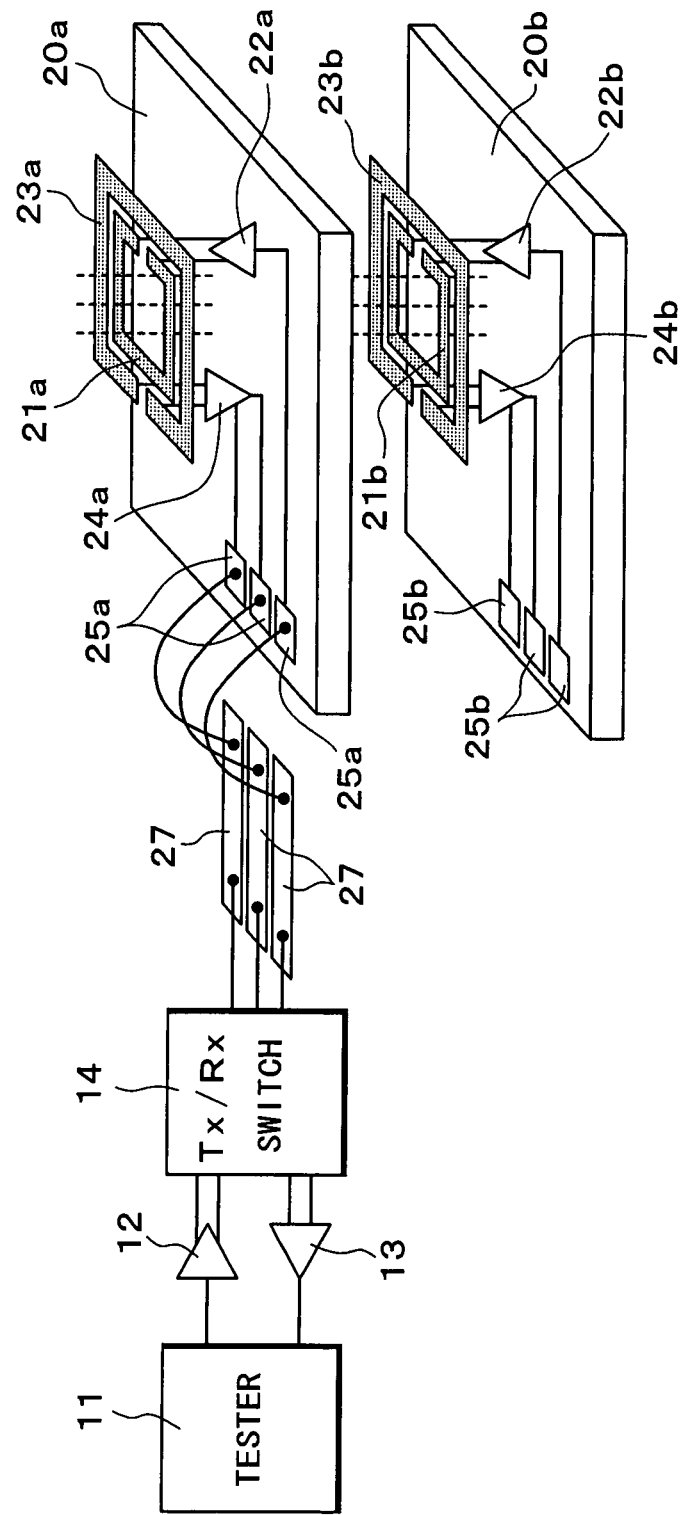
FIG. 2 is a view depicting a configuration of an electronic circuit testing apparatus according to Embodiment 2 of the invention and a configuration of an LSI chip to be tested.
Figure 3:
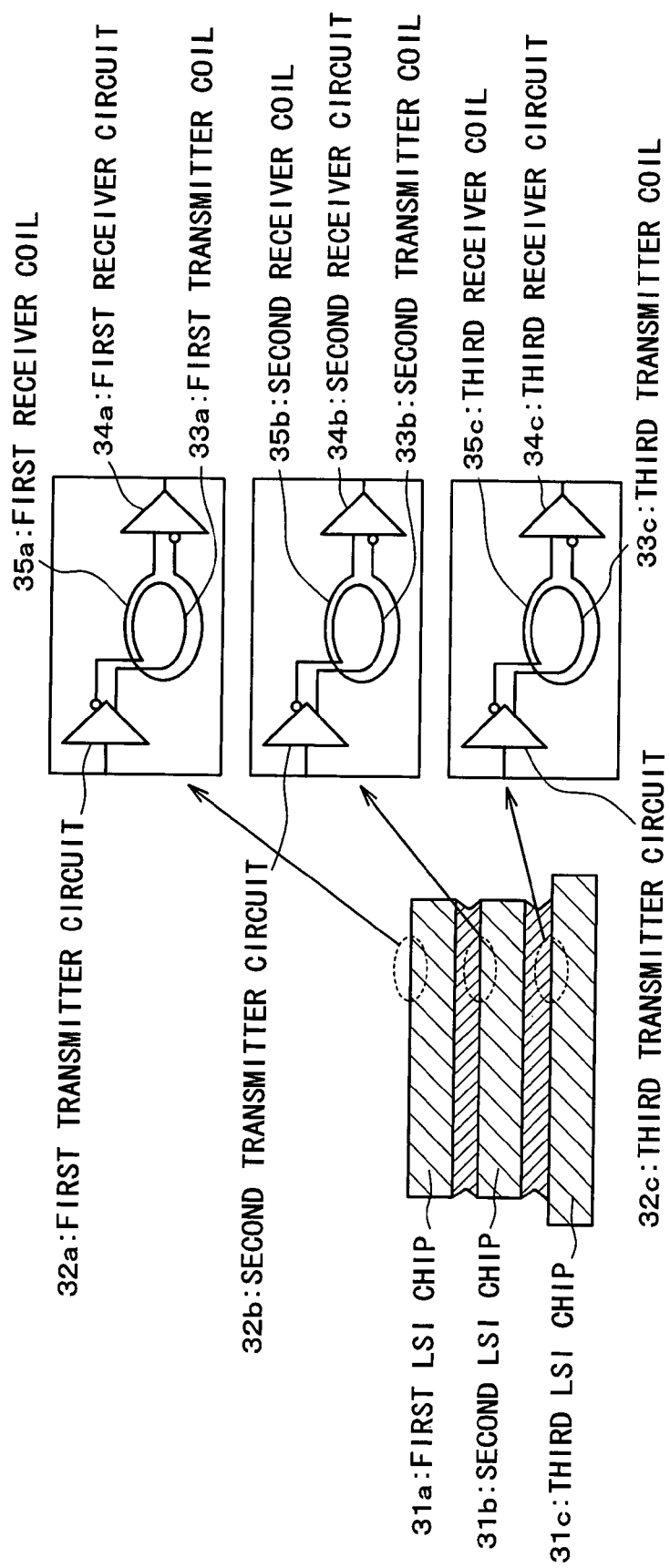
FIG. 3 is a view depicting the configuration of an electronic circuit according to the invention of Japanese earlier application.

FIG. 2 is a view depicting a configuration of an electronic circuit testing apparatus according to Embodiment 2 of the invention and a configuration of an LSI chip to be tested. An electronic circuit testing apparatus according to Embodiment 2 tests an LSI chip, and the LSI chip may be a chip placed on a wafer and before being cut or a chip after being cut. The electronic circuit testing apparatus is composed of a tester 11, buffers 12 and 13, a Tx/Rx switch 14, leads 27, and an LSI chip 20a. Thus, the electronic circuit testing apparatus according to Embodiment 2 uses, as a probe, an LSI chip 20a on which the first transmitter and receiver coils 21a and 23a are disposed at the position corresponding to the position of a communications channel of an LSI chip 20b as a test object. Therefore, the configuration of the tester 11, buffers 12 and 13, a Tx/Rx switch 14, transmitter and receiver coils 21a, 21b, 23a and 23b, and transmitter and receiver circuits 22a, 22b, 24a and 24b is the same as that of Embodiment 1. In Embodiment 2, the leads 27 are connected to the pads 25a so that test signals are supplied to the LSI chip 20a as a probe and detection signals are received by the LSI chip 20a. When testing, although power and clocks may be supplied to the LSI chip 20b based on inductive coupling, they may be supplied via the pads 25b (pad for power is not illustrated) instead if direct connection is partially permitted.

Thus, Embodiment 2 is capable of testing the object LSI chips almost or completely without touching them.

Also, the present invention is not limited to the above-described embodiments.

It is a matter of course that the configuration of the above-described embodiments can be applied to a PCB.

All the publications, patents and patent applications cited in the present specification are taken in the present specification as references.

What is claimed is:

1. An LSI chip testing apparatus, for determining whether an electronic circuit of an LSI chip is satisfactory, comprising:
   a tester for providing a test signal; and
   at least one probe operatively connected to the tester, the at least one probe having a coil for inductively transmitting the test signal to the electronic circuit of the LSI chip and inductively receiving a response signal from the electronic circuit of the LSI chip, wherein
   when inductively transmitting, the probe irradiates a magnetic line of flux toward the LSI chip and thereby becomes inductively coupled with a coil of the LSI chip, which is operatively connected to the electronic circuit, and when inductively receiving a signal from the coil connected to the electronic circuit, the probe generates an electromotive force in response to a change in the magnetic line of flux in the coil of the LSI chip such that the probe detects the response signal from the LSI chip and wherein
   the tester determines if the electronic circuit of the LSI chip is satisfactory based on the response signal.

2. The LSI chip testing apparatus according to claim 1, wherein said probe is two-dimensionally movable.

3. The LSI chip testing apparatus according to claim 2, further comprising a plurality of said probes.

4. The LSI chip testing apparatus according to claim 1, further comprising a plurality of said probes.

5. The LSI chip testing apparatus according to claim 1, wherein the LSI chip is tested while part of a wafer.

6. The LSI chip testing apparatus according to claim 1, wherein the LSI chip is tested after being cut from a wafer.

7. The LSI chip testing apparatus according to claim 1, further comprising buffers operatively connected between the tester and the at least one probe.

8. The LSI chip testing apparatus according to claim 1, further comprising a switch operatively connected between the tester and the at least one probe.

9. An LSI chip testing apparatus, for determining whether an electronic circuit of an LSI chip is satisfactory, comprising:
   a tester for providing a test signal;
   at least one probe having a coil for inductively transmitting the test signal to the electronic circuit of the LSI chip and inductively receiving a response signal from the LSI chip without the probe contacting the LSI chip, wherein
   when inductively transmitting, the probe irradiates a magnetic line of flux toward the LSI chip and thereby becomes inductively coupled with a coil of the LSI chip, which is operatively connected to the electronic circuit, and when inductively receiving a signal from the coil connected to the electronic circuit, the probe generates an electromotive force in response to a change in the magnetic line of flux in the coil of the LSI chip such that the probe detects the response signal from the LSI chip, wherein the tester determines if the electronic circuit of the LSI chip is satisfactory based on the response signal.

* * * * *